US010916291B2

(12) United States Patent
Lee et al.

(10) Patent No.: US 10,916,291 B2
(45) Date of Patent: Feb. 9, 2021

(54) APPROXIMATE MEMORY ARCHITECTURE AND DATA PROCESSING APPARATUS HAVING THE SAME

(71) Applicants: Seoul National University R&DB Foundation, Seoul (KR); University-Industry Cooperation Group of Kyung Hee University, Yongin-si (KR)

(72) Inventors: Hyuk Jae Lee, Seoul (KR); Hyun Kim, Seoul (KR); Duy Thanh Nguyen, Seoul (KR); Bo Yeal Kim, Seoul (KR); Ik Joon Chang, Yongin-si (KR)

(73) Assignees: SEOUL NATIONAL UNIVERSITY R&DB FOUNDATION, Seoul (KR); UNIVERSITY-INDUSTRY COOPERATION GROUP OF KYUNG LEE UNIVERSITY, Yongin-si (KR)

(*) Notice: Subject to any disclaimer, the term of this patent is extended or adjusted under 35 U.S.C. 154(b) by 0 days.

(21) Appl. No.: 16/539,313

(22) Filed: Aug. 13, 2019

(65) Prior Publication Data
US 2020/0381039 A1 Dec. 3, 2020

(30) Foreign Application Priority Data
May 28, 2019 (KR) .................. 10-2019-0062777

(51) Int. Cl.
*G11C 7/00* (2006.01)
*G11C 11/406* (2006.01)
*G11C 11/408* (2006.01)
*G11C 11/4094* (2006.01)

(52) U.S. Cl.
CPC ...... *G11C 11/40603* (2013.01); *G11C 11/408* (2013.01); *G11C 11/4094* (2013.01); *G11C 11/40622* (2013.01)

(58) Field of Classification Search
CPC ............... G11C 4/06; G11C 11/40615; G11C 2211/4061; G11C 11/40618; G11C 2211/4067
USPC ....................................... 365/222
See application file for complete search history.

(56) References Cited

U.S. PATENT DOCUMENTS

2010/0195412 A1* 8/2010 Furutani ................. G11C 8/18
365/189.05
2012/0099389 A1* 4/2012 Park ................. G11C 11/40622
365/200

OTHER PUBLICATIONS

Alex Krizhevsky et al., "ImageNet Classification with Deep Convolutional Neural Networks".
Kaiming He et al., "Deep Residual Learning for Image Recognition", Microsoft Research.
Song Liu et al., "Flikker: Saving DRAM Refresh-Power through Critical Data Partitionin", Conference Paper in ACM SIGPLAN Notices, Apr. 2011.

(Continued)

*Primary Examiner* — Son T Dinh
(74) *Attorney, Agent, or Firm* — Novick, Kim & Lee, PLLC; Jae Yours Kim

(57) ABSTRACT

The provided is a method of controlling a dynamic random-access memory (DRAM) device comprising: storing a plurality of pieces of data consisting of a plurality of bits in a memory in a transposed manner; setting at least one refresh period for each of a plurality of rows constituting the memory; and performing a refresh operation of the memory on the basis of the set refresh period.

16 Claims, 8 Drawing Sheets

(56) References Cited

OTHER PUBLICATIONS

Jan Lucas et al., "Sparkk: Quality-Scalable Approximate Storage in DRAM", The Memory Forum, pp. 1-6.
Christian Szegedy et al., "Going Deeper with Convolutions", IEEE, pp. 1-9.
Karen Simonyan et al., "Very Deep Convolutional Networks for Large-Scale Image Recognition", Conference paper at ICLR 2015, pp. 1-14.

\* cited by examiner

| Refresh period (s) | Bit error at 25°C | Bit error at 60°C | Bit error at 80°C | Bit error at 90°C |
|---|---|---|---|---|
| 1 | 0 | 1.87196E-7 | 0.00025795 | 0.00225826 |
| 2 | 0 | 4.00958E-6 | 0.00194832 | 0.01180268 |
| 3 | 1.16415E-9 | 2.10621E-5 | 0.00597532 | 0.02738172 |
| 4 | 4.42378E-9 | 5.73678E-5 | 0.01404861 | 0.04950775 |
| 5 | 1.39698E-8 | 0.00023114 | 0.02723729 | 0.07771726 |
| 6 | 2.39816E-8 | 0.00040858 | 0.03963425 | 0.10455954 |
| 7 | 4.02797E-8 | 0.00062755 | 0.04637795 | 0.11369069 |
| 8 | 6.61239E-8 | 0.00069538 | 0.05646876 | 0.13063926 |
| 9 | 9.33651E-8 | 0.00135385 | 0.07410479 | 0.16315238 |
| 10 | 1.35973E-7 | 0.00226014 | 0.07608483 | 0.16615006 |

APPROXIMATE MEMORY ARCHITECTURE AND DATA PROCESSING APPARATUS HAVING THE SAME

TECHNICAL FIELD

The present invention relates to a memory architecture, and more particularly, to a memory architecture using in deep-learning application.

BACKGROUND ART

A DRAM device requires periodic refresh operations to preserve data integrity, which incurs significant power consumption.

Slow refresh may cause a loss of data stored in a DRAM cell, which affects the correctness of the computation using the lost data.

Deep learning applications require a large amount of computation with excessive data traffic from memory. The complexities of deep learning algorithms keep increasing as the numbers of the layers in neural networks is rapidly growing in order to improve its performance.

For instance, AlexNet proposed in 2012 uses 8 layers whereas ResNet proposed in 2015 is implemented with 152 layers. Under such a trend, memory bandwidth may become one of the biggest bottlenecks for the speed-up of deep learning applications.

Therefore, extensive research has been conducted to reduce the amount of memory access.

Because a DRAM cell cannot retain the stored data permanently, it requires the stored data read out periodically and then written back to the same memory cell. This refresh operation is necessary for all cells in a DRAM whether they store significant data or not. Therefore, this refresh incurs significant power consumption even though certain DRAM cells do not store the data which are accessed by an active process in a processor. As a DRAM density increases, the power consumption by refresh also increases. The ratio of the refresh power consumption against the total power consumption by a DRAM increases in proportion to the density of the DRAM.

In a future 64 Gb DRAM, the refresh is expected to account for up to 50% of the total power consumption. Therefore, the refresh power consumption should be considered as one of the most critical parameters in computing system design.

Various refresh management techniques have been presented to save power consumption. By default, these ideas require an OS to figure out the retention time information of each DRAM row. A DRAM controller uses this information to selectively perform the refresh operation for each row.

According to the above method, an unnecessary refresh operation can be omitted, so that the power consumption by the refresh operation of the DRAM can be reduced.

However, it is not cost effective and scalable to store the retention time information of all the rows of a DRAM of which size keeps increasing.

Moreover, profiling retention time information of all DRAM cells takes a significant amount of effort and also may get incorrect results as it has to deal with Variable Retention Time (VRT) and Data Pattern Dependencies (DPD).

There exists another approach that dramatically reduces the power consumption by allowing a slight possibility of error occurrence in DRAM cells.

Although the errors may drop the accuracy of computation results, the effect may be tolerable in deep learning applications because the accuracy of deep neural networks may not degrade significantly in the presence of errors.

Previous study shows that high precision computation can be sacrificed to achieve good learning performance.

It is also shown that both training and test performance exhibit a negligible degradation even when a limited precision is used for computation.

The previous study presents a software solution named Flikker to partition program data to critical and non-critical, and to save refresh energy for non-critical data by storing them to approximate memory. On the other hand, Sparkk, presented in [9], proposes adjustment of the refresh period for each bit of data at different rate based on its importance.

To take advantage of the approach that allows error presence, this paper proposes a new memory architecture, called approximate memory architecture, that allows the possibility of storage errors by adaptively controlling the refresh rate of DRAM cells. For the cells that store less important data, the approximate memory slows down the refresh rate. As a result, power consumption by refresh operation is significantly reduced while the stored data may be lost due to delayed refresh operations. The effectiveness of the approximate memory architecture depends on how to separate important data from the other data and store them in the same row so that they are stored safely while the other insignificant data are stored in the rows with a slow refresh rate that may causes errors. The proposed memory architecture reorganizes the data storage pattern in a transposed manner so that data bits are stored according to their significances. Simulation results with state-of-the-art networks, GoogLeNet [10] and VGG-16 [11], show the refresh power consumption is significantly reduced by 69.68% with a negligible degradation of the accuracy.

The rest of this paper is organized as follows. Section II presents the proposed approximate architecture, Section III shows the simulation results and Section IV gives the conclusion of this paper.

DISCLOSURE OF THE INVENTION

Therefore, an object of the present invention is to provide a DRAM architecture capable of minimizing power consumption by a refresh operation and a data processing apparatus including the DRAM architecture.

It is also an object of the present invention to provide a DRAM architecture and a data processing apparatus including the DRAM architecture that reduce the number of refresh operations of the DRAM by utilizing the error tolerance of the deep learning application.

It is also an object of the present invention to provide a DRAM architecture capable of variably setting a refresh operation cycle for each row or cell of a DRAM and a data processing apparatus including the DRAM architecture.

It is another object of the present invention to provide a DRAM architecture capable of applying different refresh operation cycles according to data importance by storing data in a transposed manner, and a data processing apparatus including the DRAM architecture.

To achieve these and other advantages and in accordance with the purpose of the present invention, as embodied and broadly described herein, there is provided an approximate memory architecture for a reduction of refresh power consumption.

Specifically, a method of controlling a dynamic random-access memory (DRAM) device disclosed in the present invention, comprises storing a plurality of pieces of data consisting of a plurality of bits in a memory in a transposed manner, setting at least one refresh period for each of a plurality of rows constituting the memory and performing a refresh operation of the memory on the basis of the set refresh period.

In an embodiment, wherein the storing of the data in the memory in the transposed manner comprises storing the bits of the plurality of pieces of data in the plurality of rows constituting the memory sequentially from a most significant bit (MSB) to a least significant bit (LSB).

In an embodiment, wherein the plurality of bits constituting the data include a sign bit, an exponential bit, and a mantissa bit, and the storing of the data in the memory in the transposed manner comprises: storing a sign bit and an exponential bit for each of the pieces of data in some of the rows; and storing a mantissa bit for each of the pieces of data in the other rows.

In an embodiment, wherein, the data is composed of one sign bit, eight exponential bits, and 23 mantissa bits, the sign bits of the plurality of pieces of data are stored in a first row of the memory, the exponential bits of the plurality of pieces of data are stored in second to ninth rows of the memory, and the mantissa bits of the plurality of pieces of data are stored in tenth to 32nd rows of the memory.

In an embodiment, wherein the setting of the refresh period comprises: setting a first period value for some of the plurality of rows of the memory in which the sign bits or the exponential bits are stored; and setting a second period value for the other rows of the memory in which the mantissa bits are stored.

In an embodiment, wherein the second period value is set to be greater than the first period value.

In an embodiment, wherein the performing of the refresh operation comprises: increasing a counter every first period; and determining whether to perform the refresh operation for each row of the memory on the basis of the counter every first period.

In an embodiment, wherein the performing of the refresh operation comprises: increasing a counter every preset refresh period; and determining whether to perform the refresh operation for each of the plurality or rows on the basis of a value of the counter and a refresh period set for each row.

In an embodiment, wherein the performing of the refresh operation comprises: performing the refresh operation on some of the plurality of rows whenever the counter is increased; and performing the refresh operation on the other rows when the counter corresponds to a predetermined value.

A data processing apparatus disclosed in the present invention, comprises: a processor configured to operate a deep learning application; a memory device configured to store data related to the deep learning application; and a memory controller configured to control a data storage scheme of the memory device, wherein the memory device is composed of a plurality of rows and is configured to store a plurality of pieces of data in a transposed manner, perform a refresh operation on at least some of the plurality of rows every predetermined first period, and perform the refresh operation on the other rows every second period, the second period being different from the first period.

In one embodiment, the memory controller stores a plurality of sign bits extracted from the plurality of pieces of data in a first address area of the memory device, stores a plurality of exponential bits extracted from the plurality of pieces of data in a second address area of the memory device, and stores a plurality of mantissa bits extracted from the plurality of pieces of data in a third address area of the memory device.

In one embodiment, when the plurality of pieces of data is 32-bit floating-point data, the first address area corresponds to a first row of the memory device, the second address area corresponds to second to ninth rows of the memory device, and the third address area corresponds to tenth to 32nd rows of the memory device.

In one embodiment, where the memory device is configured to perform the refresh operation every predetermined period after the plurality of pieces of data are stored in the transposed manner and is configured to skip the refresh operation for at least some of the plurality of rows.

In one embodiment, when the refresh operation is initiated, the memory device increases a predetermined counter variable every period and determines whether to perform the refresh operation on the at least some of the plurality of rows on the basis of the increased counter variable.

In one embodiment, a plurality of mantissa bits of the plurality of pieces of data are stored in the at least some of the plurality of rows.

In one embodiment, the memory device performs the refresh operation on at least one row in which the mantissa bits of the plurality of pieces of data are stored and at least one row in which sign bits or exponential bits of the plurality of pieces of data are stored at different periods.

In one embodiment, the memory device performs the refresh operation on the at least one row in which the sign bits or exponential bits are stored at a predetermined period and skips the refresh operation at least once for the at least one row in which the mantissa bits are stored while the refresh operation is performed a plurality of times.

MODES FOR CARRYING OUT THE PREFERRED EMBODIMENTS

Reference will now be made in detail to the preferred embodiments of the present invention, examples of which are illustrated in the accompanying drawings. It will also be apparent to those skilled in the art that various modifications and variations can be made in the present invention without departing from the spirit or scope of the invention. Thus, it is intended that the present invention cover modifications and variations of this invention provided they come within the scope of the appended claims and their equivalents.

Figure 1A:
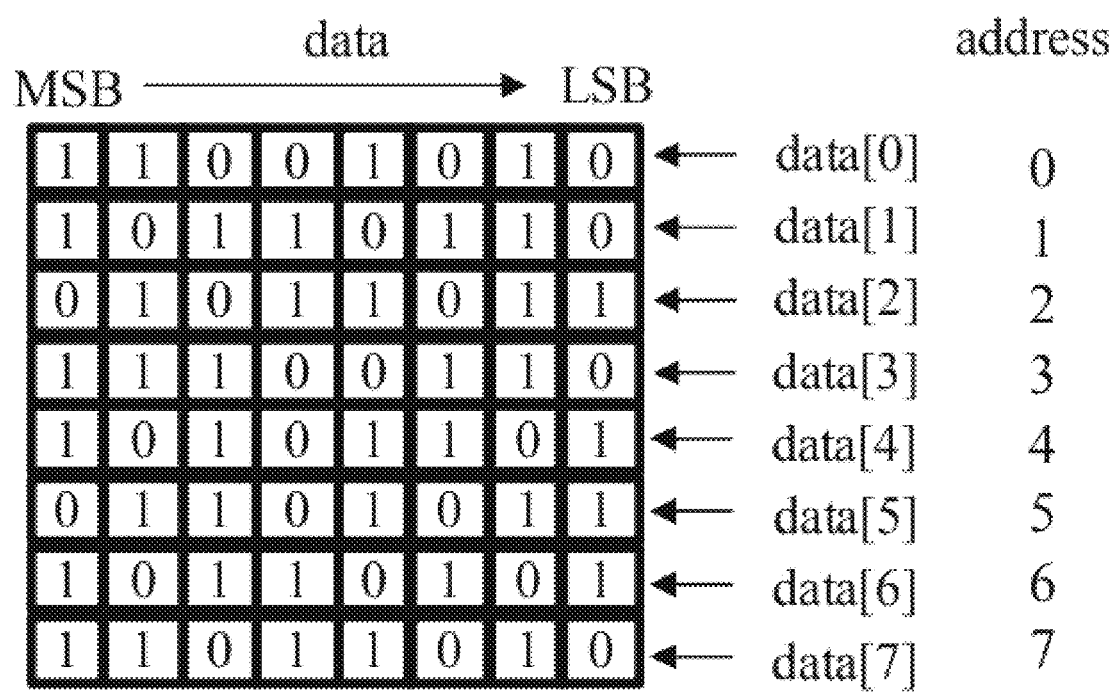
FIG. 1A is a conceptual view showing the manner in which a conventional memory stores data.
Figure 1B:
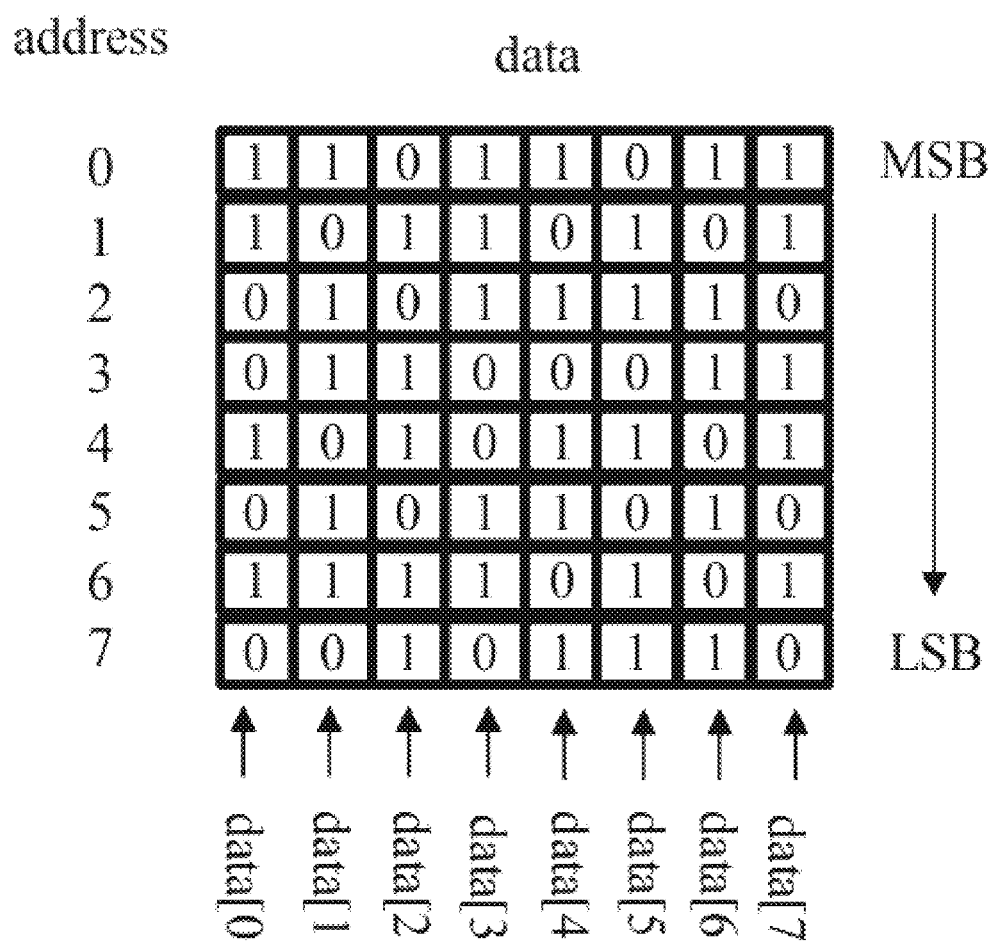
FIG. 1B is a conceptual view showing a data storage method corresponding to a memory architecture according to the present invention.

FIG. 1A shows a conventional memory storing data, and FIG. 1B shows a data storing method of the approximate memory proposed in the present invention.

Specifically, referring to FIG. 1A, data [0] (=11001010) is stored at a memory location of address 0, and data [1] (=10110110) is stored at address 1.

As shown in FIG. 1B, the approximate memory stores the data in a transposed manner such that all the MSBs from data[0] to data[7] are stored in the memory location at addressed 0. The second most significant bits of data[0], data[1], . . . , data[7] are all stored at address 1, and so on.

That is, the approximate memory proposed in the present invention is a memory in which all the most significant bits (MSBs) of data [0] to data [7] are stored at memory locations of address 0.

Similarly, the second most significant bits of data [0] to data [7] are all stored at address 1. In this case, when address 0 is accessed by the host processor, only the most significant bits (MSBs) are delivered to the processor.

According to the data distribution shown in FIG. 1B, the refresh frequency can be variably set according to the importance of the row.

The data distribution shown in FIG. 1B, is to give a different refresh rate depending on the significance of the row. In the example in FIG. 1B, the data stored at address 0 are the MSBs that are, in general, most important bits of data.

Therefore, any occurrence of errors in these data may severely affect the outcome of computation using these data. On the other hand, the data at address 7 consist of the least significant bits (LSBs) of data.

Because these data may be relatively insignificant, a loss of these data may not badly affects the result. In a deep learning application for object classification, for example, the accuracy of the classification may not be significantly degraded. In this case, the refresh period at address 7 may be prolonged, which can reduce the power consumption for refreshment.

Although the prolonged refresh period may result in the occurrence of errors in these data, the outcome of computation may not be affected severely thanks to the insignificance of these data at address 7. In this manner, the new data distribution as shown in FIG. 1B allows the refresh rate to be controlled depending on the significance of data. For less significant data, power consumption for refresh operation is reduced with prolonged refresh period. For significant data, on the other hand, the normal refresh period is maintained to avoid any occurrence of errors The transposed data storage shown in FIG. 1B requires the DRAM to be accessed in a blocked manner. To access one byte of data[0], a host needs to request the data stored from addresses 0 to 7. This means that the host needs eight memory accesses to access a single byte of a data. Therefore, this memory architecture is inefficient when a single byte of data is accessed.

On the other hand, the inefficiency can be avoided if a block of data are accessed together. For example, a block of data from data[0] to data[7] are accessed together, eight data accesses are necessary for the eight bytes of data. Therefore, no unnecessary data request is required in this case.

In order to support the data storage scheme shown in FIG. 1B, a computer system requires a memory controller that converts the data format when it fetches the data from a memory and delivers them to the host.

Figure 1C:
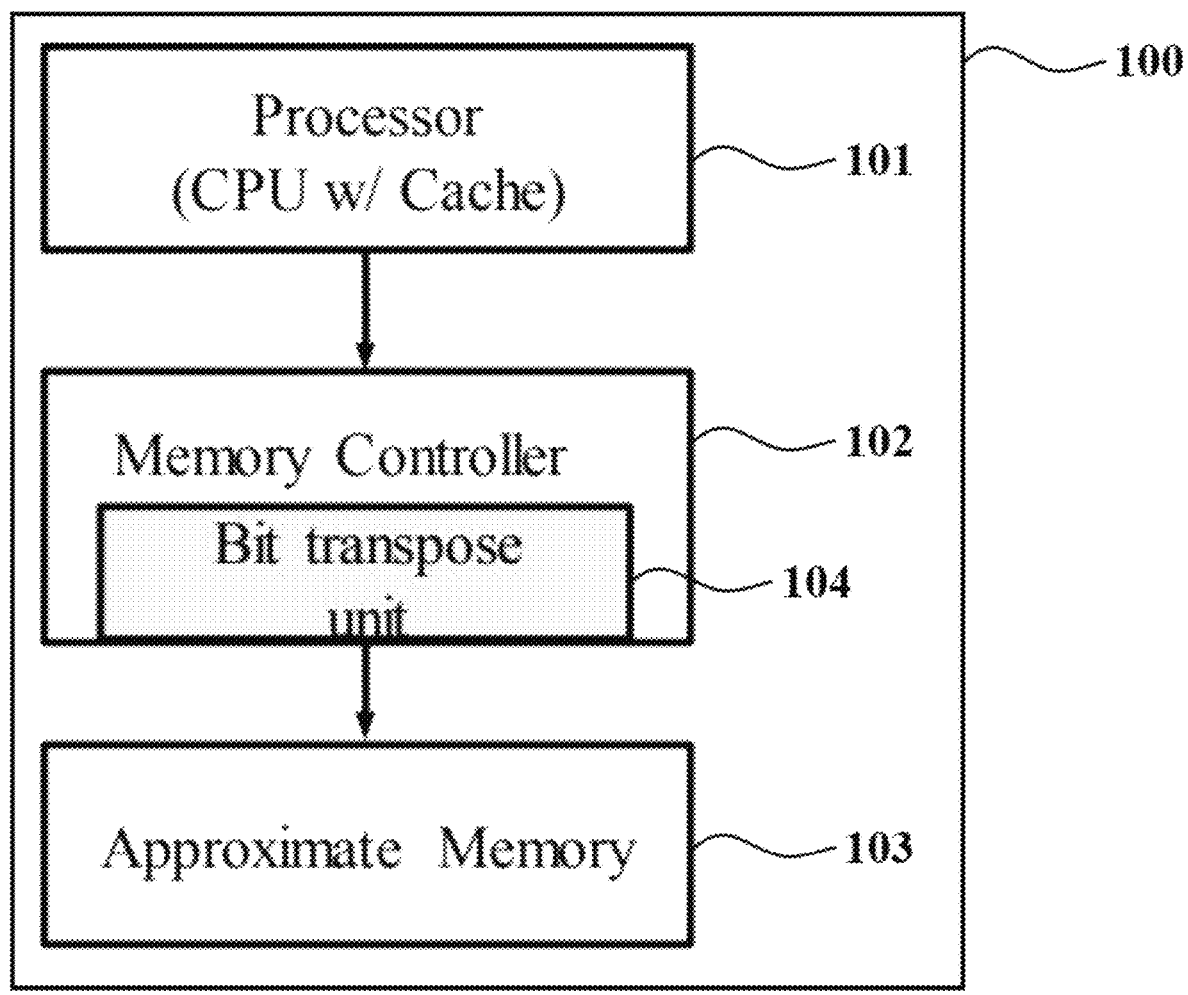
FIG. 1C is a block diagram showing a memory controller for implementing the data distribution shown in FIG. 1B.

Therefore, a memory controller needs a hardware unit, called the "bit transposed unit" as shown in FIG. 1C which is responsible for the data format conversion.

Figure 2:
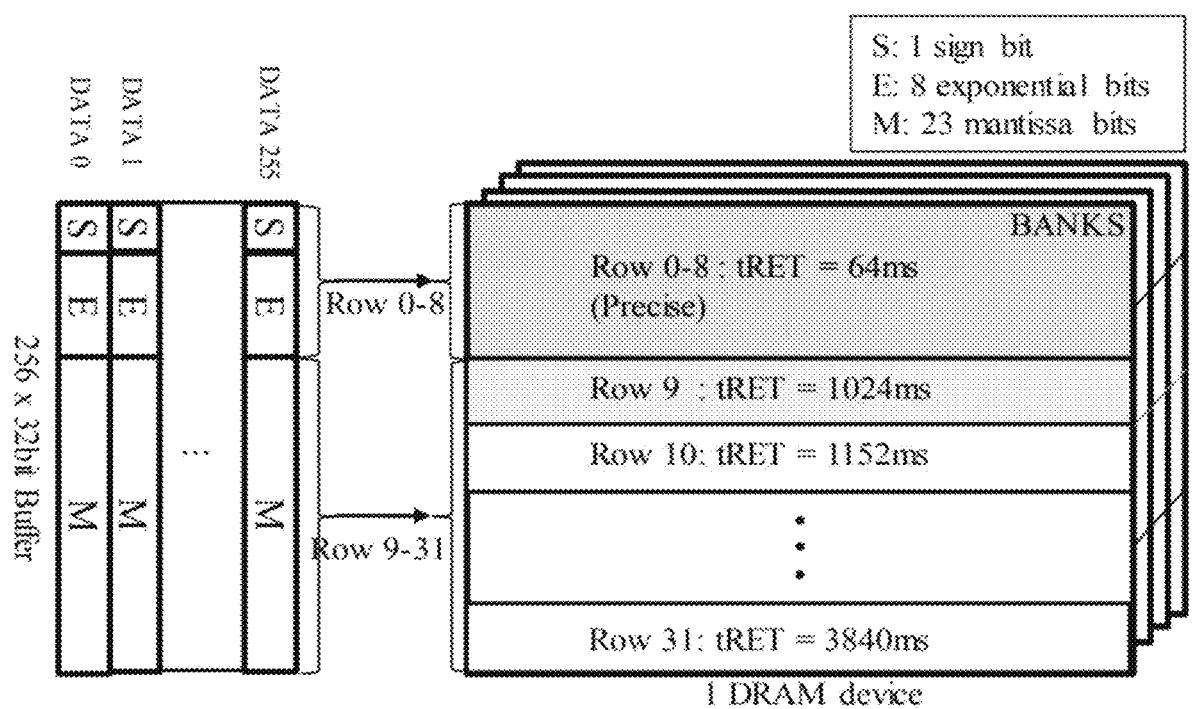
FIG. 2 is a conceptual diagram showing an example of 32-bit floating point data of an approximate memory according to the present invention.
Figure 3:
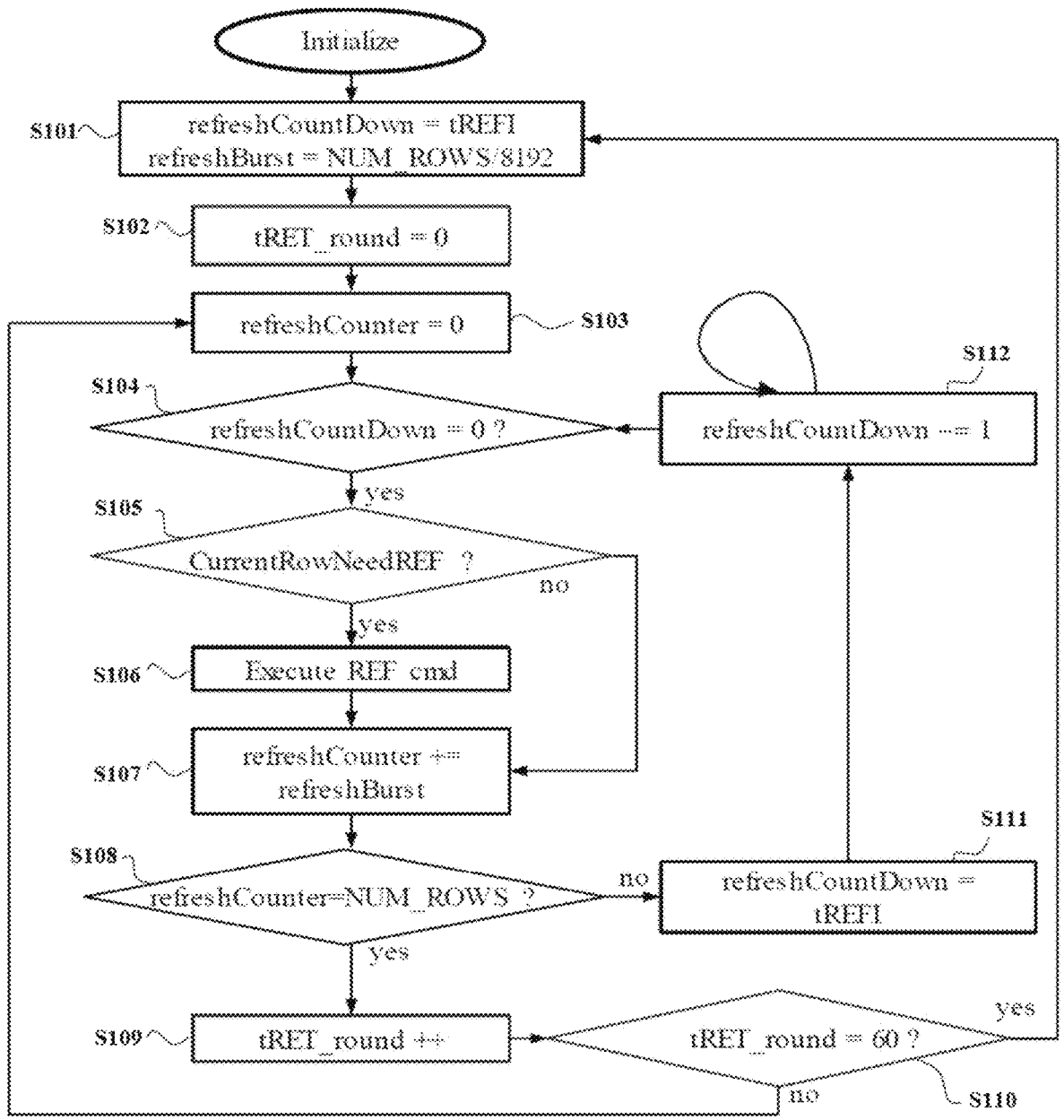
FIG. 3 is a flow chart showing a low-level refresh algorithm in accordance with the present invention.

A deep learning application, in general, accesses a 32-bit floating-point data. FIG. 2 shows an example of the 32-bit floating point data of the approximate memory proposed by the present invention.

In the example of FIG. 2, only 32 rows per bank of DRAM are described for simplicity. Each floating-point data has 1 sign bit, 8 exponent bits, and 23 mantissa bits. The sign bit and the exponent bit are relatively high-priority bits. If an error occurs in the corresponding bit, the data value can be largely changed. For reference, the associated simulation results show that errors on the sign bit and the exponent bit significantly reduce the accuracy of the data calculation results. The simulation results are described in more detail below.

Hence, these 9 MSBs are refreshed at the normal rate that is 64 ms (tRET=64 ms) and stored at rows 0 to 8, respectively. On the other hand, since the importance of the 23 mantissa bits is relatively low, they are stored at approximate rows from 9 to 31.

The refresh operation period applied to the bits of the approximate row increases as the row number increases, so that fewer bits are stored in the row with low error probability.

In one example, as the row number increases, the period of the refresh operation may increase linearly.

$$RP(n) = \begin{cases} 64 & \text{for } 0 \le n \le 8 \\ (n-9)*incr + \text{offset} & \text{for } 9 \le n \le 31 \end{cases} \quad \text{[equation 1]}$$

In the above equation (1), RP(n) represents the refresh period of the n-th row, and two parameters incr and offset, are experimentally selected. It should be noted that RP(n) must be a multiple of 64 ms so that the proposed row-level refresh algorithm can be applied.

As the offset increases, the refresh rate also increases. Consequently, the power consumption by the refresh operation is reduced at the expense of increasing the error probability.

According to the simulation results when the two parameters incr and offset are set to 1024 ms and 128 ms, respectively, the DRAM device provides a sufficient power reduction of 69.68% with negligible accuracy reduction.

On the other hand, in order to adjust the refresh period, the internal logic of the DRAM device according to the present invention may be partially changed. To this end, one additional counter for storing the current tRET round (64 milliseconds for each tRET round) and the current row must be refreshed so that the DRAM device can skip the refresh operation for the nearest row There is additional logic to determine if the A low-level refresh algorithm in accordance with the present invention is shown in FIG. In a normal refresh operation of a DRAM device, the memory controller issues an 8K auto-refresh command. For a DRAM device with 8K rows per bank, one auto-refresh command refreshes one row per bank at the refresh interval (tREFI=64 ms/8K=7.8 us).

In the following embodiment, when the parameter offset is 1024 ms and the parameter incr is 128 ms, it is possible to explain which logic circuit needs a certain row as follows.

Rows 0 through 8 are always refreshed regardless of the current tRET round.

Row 9 is refreshed only when the tRET round is 15. For reference, the refresh period of row 9 is defined as 1024 ms or 16*tRET.

Likewise, rows 10 to 31 perform refresh when tRET is 17, 19, . . . 59. While the DRAM device skips the refresh operation for the approximate row, the external memory controller periodically transmits the 8K refresh command periodically at normal speed for every tRET round.

The buffer size of the transposed unit is calculated as follows. To avoid additional data transmission, 32 pieces of data are transmitted together in a blocked manner.

The transfer unit temporarily stores data to be transferred using an additional buffer to support data transfer. Assuming that the burst length of the DRAM is 8 (BL=8) and the data width is 32 bits, a single data access to the DRAM transfers 256 bits.

Thus, the size of the buffer is implemented as 256×32 bits. In order to transfer data between the buffer and the DRAM, 32 instructions for the DRAM are required, so that the waiting time may be longer.

On the other hand, since the deep running application generally accesses data in a predictable manner, data prefetching techniques can be applied to prevent such an increase in latency.

Hereinafter, the simulation results for evaluating the reduction of the power consumption as well as the degradation of accuracy when the approximate memory architecture according to the present invention is used in a Convolution Neural Network (CNN) application will be described.

Using the pre-trained model in the Caffe library, GoogLeNet (7 million parameters) and VGG-16 (138 million parameters) are used in the simulation. For the sake of simulation, it is assumed that the CNN model is stored in an approximate memory as described above.

The DRAM refresh power reduction is measured by calculating the number of skipped refresh commands. The reduction of the refresh power is mathematically derived from the following equation.

$$Psave = 1 - \frac{9 + \sum_{n=0}^{22} 64/(n*incr + \text{offset})}{32} = 0.71875 - \sum_{n=0}^{22} \frac{2}{(n*incr + \text{offset})}$$

[equation 2]

Figure 4:
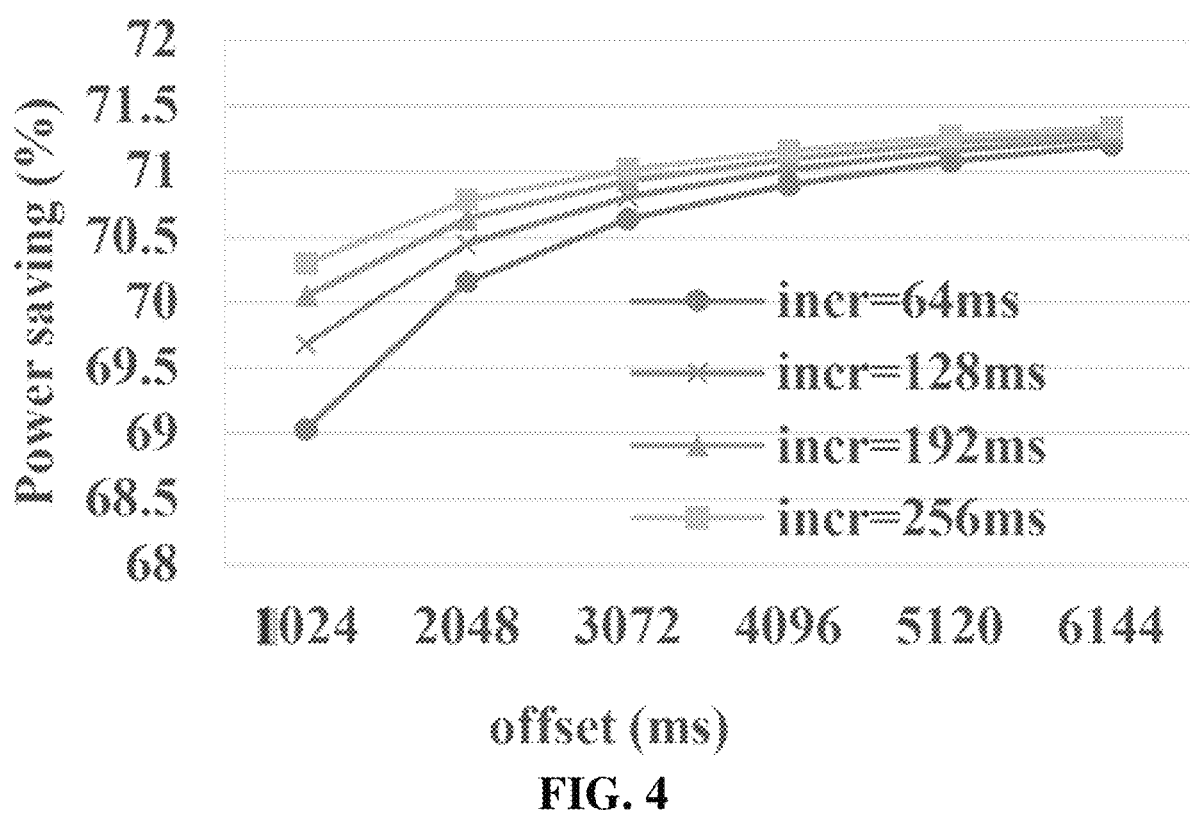
FIG. 4 is a graph showing refresh power reduction.

In Equation (2), n, incr, and offset are the same as those defined in Equation (1). FIG. 4 shows the refresh power reduction with respect to these parameters. The refresh power reduction is nearly saturated at about 71% when the offset is 4,096 ms.

The following simulation is performed to estimate the accuracy reduction by approximation. The data related to the error rate due to the long refresh rate is summarized in FIG. 7.

Since the error rate depends on the operating temperature of the DRAM, the influence of the temperature change on the error rate is shown.

Error injection to CNN model is performed as follows.

Figures 7, 8:
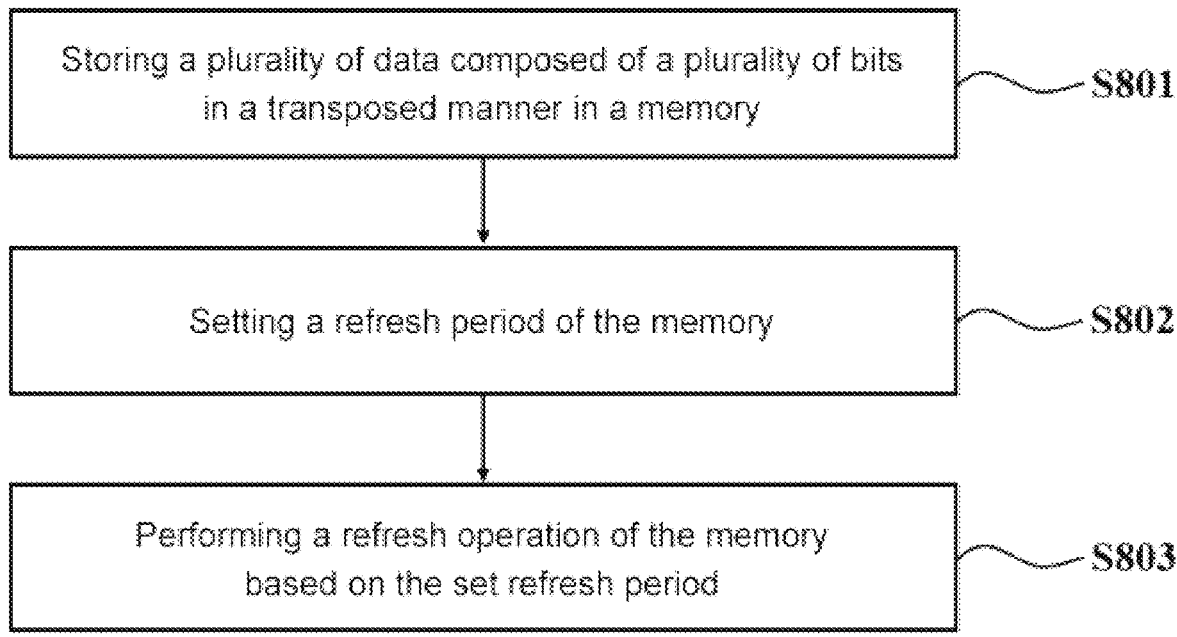
FIG. 7 is a table showing the accuracy variation according to the temperature and the refresh period variation.
FIG. 8 is a flow chart showing a DRAM device controlling method in accordance with the present invention.

Given the bit error probability of FIG. 7, the error rate of the user-defined refresh period is linearly corrected. Thus, the error probability of each data bit is derived.

In each test, the positions of the bit flips are randomly selected according to a uniform distribution.

In order to measure the accuracy of the approximate memory architecture according to the present invention, a set of 10,000 test images of the ImageNet 2012 dataset is used. Each inference test is repeated for tens of times, then an average accuracy is calculated. The inference accuracy of each test is the highest accuracy that is normalized to the accuracy of the test without using memory approximation.

Figure 5:
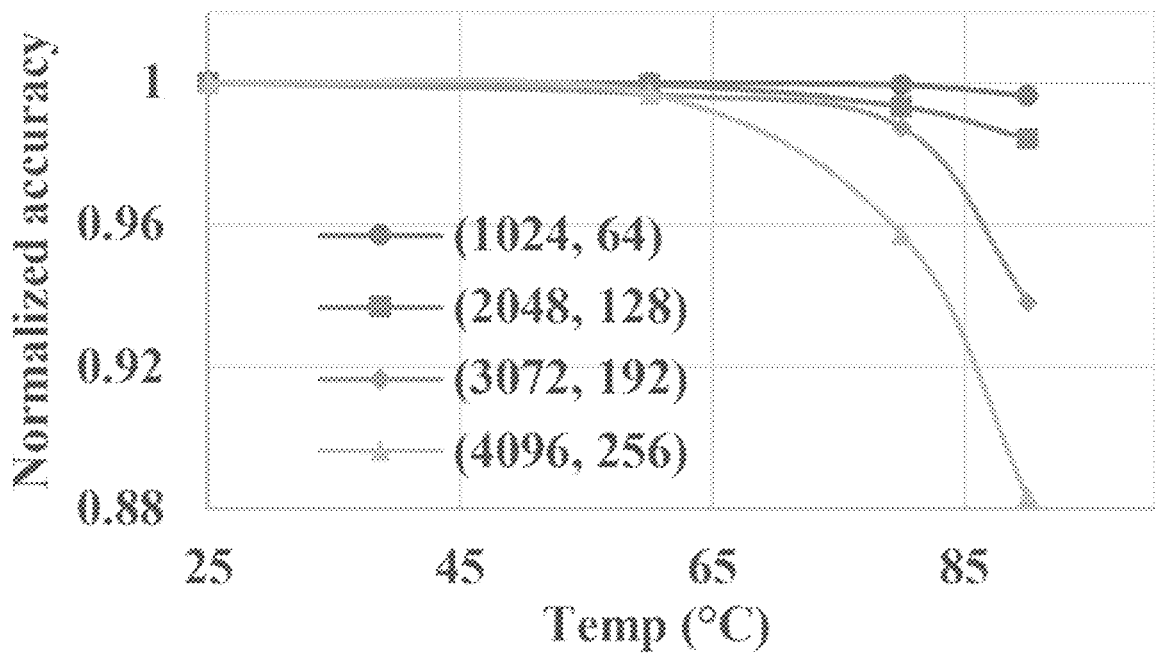
FIG. 5 is a graph showing the accuracy degradation of GoogLeNet in various combinations of two parameters offset and incr.

FIG. 5, on the other hand, shows the inaccuracy of GoogLeNet in various combinations of two parameters offset and incr. The horizontal axis represents the operating temperature.

According to the simulation results, the accuracy loss at temperatures below 60° C. can be ignored in all (offset, incr) pairs. On the other hand, the accuracy loss increases at temperatures higher than 60° C. The simulation results of VGG-16 are similar to GoogLeNet.

The following simulations are performed at temperatures higher than 60° C.

Figure 6:
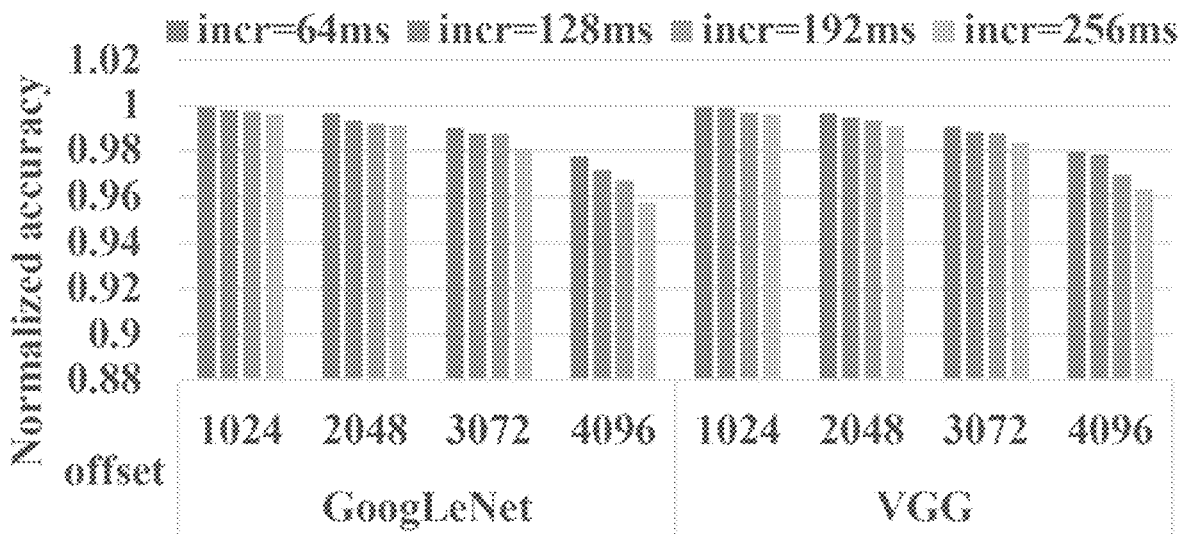
FIG. 6 is a graph showing the accuracy drop of GogLeNet and VGG-16 with increasing temperature.

FIG. 6 shows the accuracy drops of GoogLeNet and VGG-16 at high temperature 80° C.

As shown in FIG. 6, offset of 1024 ms does not degrade much the accuracy while achieving a large refresh power reduction. The accuracy of both (1024, 64) and (1024, 128) are higher than 99.8% while (1024, 128) saves power consumption a little bit more than (1024, 64) does. The parameters (1024, 128) saves 69.68% of power consumption while preserving well the accuracies of these CNNs.

On the other hand, by storing more MSBs in the approximate memory, further simulations are performed to ascertain whether the power consumption is further reduced.

Both parameters offset and incr are set to the minimum value of (1024, 64). If only the seven MSBs are correctly maintained, this accuracy drops significantly to 97.65% and 55.81%, respectively. This is an expected result because the data value changes significantly due to erroneous exponent bits. Therefore, all exponent bits must be maintained without error.

According to the present invention described above, the refresh operation for non-critical data is skipped while maintaining the accuracy of an application having an error resilience such as a deep run even at a high temperature, We propose a new approximate memory architecture that can save about 70%.

The proposed approximate memory architecture can be implemented by changing only the internal logic of a DRAM device and does not require the addition of a separate major hardware element.

A control method of a DRAM device is proposed as one embodiment of the present invention described above.

A control method of a DRAM device showing in FIG. 8, includes a step (S801) of storing a plurality of data composed of a plurality of bits in a transposed manner in a memory, and a step (S802) of setting a refresh period of the memory, and performing a refresh operation of the memory based on the set refresh period (S803).

In one embodiment, the step of storing the data in a transposing manner in a memory (S801) includes the step of, in a plurality of rows constituting the memory, the most significant bit (MSB) to least significant bit (LSB) And storing the data in a sequential manner.

That is, by storing the data in the memory in a transposed manner, the data can be distributed in the DRAM device in the manner as shown in FIG. 1B.

In addition, the plurality of bits constituting the data may include a sign bit, an exponent bit and an mantissa bit. The step of storing the data in a memory in a transposing manner may include storing a sign bit and an exponent bit of each of the plurality of data in a partial row of the memory, And storing it in the remaining rows.

In one embodiment, the data is comprised of a sign bit, 8 bits of exponent bits, and 23 bits of mantissa bits, Wherein the sign bits of the plurality of data are stored in rows and the exponent bits of the plurality of data are stored in the second to ninth rows of the memory, The mantissa bits of a plurality of data can be stored.

In one embodiment, the step of setting the refresh period (S802) comprises the steps of setting a first period value for a part of the rows in which the sign bits or the exponent bits are stored among a plurality of rows of the memory, And setting a second period value for the remaining rows in which the mantissa bits of the plurality of rows of the memory are stored.

At this time, the second period value may be set longer than the first period value. That is, the refresh period of a row in which a mantissa bit is stored can be set longer than a row in which a sign bit or an exponent bit is stored.

The step of performing the refresh operation S803 may include the steps of increasing a counter for each of the first periods and determining whether refreshing is performed for each row of the memory based on the counter for each of the first periods Process.

In one embodiment, the step of performing the refresh operation (S803) includes the steps of increasing the counter for every preset refresh period, and for changing the value of the counter and the refresh period And determining whether or not the refresh is performed.

The step of performing the refresh operation (S803) includes the steps of: performing a refresh operation for each of a plurality of the rows, the refresh operation being performed every time the counter is incremented; And performing a refresh operation when the value of the refresh operation corresponds to the value of the refresh operation.

That is, the control method of a DRAM device according to the present invention can perform a refresh operation only for a row in which a mantissa bit is stored, when the counter corresponds to a specific value. As a result, the refresh operation for the mantissa bits is skipped when the counter does not correspond to the specific value, and the DRAM device according to the present invention can omit the unnecessary refresh operation.

The data processing apparatus 100 proposed by the present invention can also include a processor 101 and an approximate memory device 103 and a memory controller 102 as shown in FIG. 1C.

Specifically, the data processing apparatus 100 according to the present invention includes a processor 101 for operating a deep learning application, a memory device 103 for storing data related to the deep learning application, Wherein the memory device comprises a plurality of rows and stores a plurality of data in a transposed manner and for at least a portion of the plurality of rows, The refresh operation is performed every one cycle and the refresh operation is performed every second cycle different from the first cycle for the remaining part.

In order to store data in a transposition manner, the memory controller 102 may include a bit transition unit 104.

In one embodiment, the memory controller stores a plurality of sign bits extracted from the plurality of pieces of data in a first address area of the memory device, stores a plurality of exponential bits extracted from the plurality of pieces of data in a second address area of the memory device, and stores a plurality of mantissa bits extracted from the plurality of pieces of data in a third address area of the memory device.

In one embodiment, when the plurality of pieces of data is 32-bit floating-point data, the first address area corresponds to a first row of the memory device, the second address area corresponds to second to ninth rows of the memory device, and the third address area corresponds to tenth to 32nd rows of the memory device.

In one embodiment, where the memory device is configured to perform the refresh operation every predetermined period after the plurality of pieces of data are stored in the transposed manner and is configured to skip the refresh operation for at least some of the plurality of rows.

In one embodiment, when the refresh operation is initiated, the memory device increases a predetermined counter variable every period and determines whether to perform the refresh operation on the at least some of the plurality of rows on the basis of the increased counter variable.

In one embodiment, a plurality of mantissa bits of the plurality of pieces of data are stored in the at least some of the plurality of rows.

In one embodiment, the memory device performs the refresh operation on at least one row in which the mantissa bits of the plurality of pieces of data are stored and at least one row in which sign bits or exponential bits of the plurality of pieces of data are stored at different periods.

In one embodiment, the memory device performs the refresh operation on the at least one row in which the sign bits or exponential bits are stored at a predetermined period and skips the refresh operation at least once for the at least one row in which the mantissa bits are stored while the refresh operation is performed a plurality of times.

According to the approximate memory architecture proposed in the present invention, since the number of refresh operations can be reduced, the power consumption by the refresh operation is minimized.

Particularly, when the approximate memory architecture proposed in the present invention is used in a deep learning application, the effect of reducing the power consumption of the DRAM can be obtained while maintaining the learning performance of the deep learning.

For data storage of a deep running application, a streamlined DRAM architecture stores the data in a transformed manner, so that the stored data is sorted according to importance.

In addition, such a DRAM organization is modified to support refresh period control according to the importance of the stored data. In this regard, referring to the results of the simulations of GoogLeNet and VGG-16, the classification accuracy has been reduced significantly for both GoogLeNet and VGG16, resulting in a 69.68% reduction in power consumption of the DRAM.

The invention claimed is:

1. A method of controlling a dynamic random-access memory (DRAM) device, the method comprising:
    storing a plurality of pieces of data including a plurality of bits in a memory in a transposed manner;
    setting at least one refresh period for each of a plurality of rows of the memory; and
    performing a refresh operation of the memory on the basis of the at least one set refresh period,
    wherein:
    the plurality of bits of the plurality of pieces of data include a sign bit, an exponential bit, and a mantissa bit, and the storing of the data in the memory in the transposed manner comprises:
  storing the sign bit and the exponential bit for each of the plurality of pieces of data in some of the plurality of rows; and
  storing the mantissa bit for each of the plurality of pieces of data in other rows of the plurality of rows.

2. The method of claim 1, wherein the storing of the data in the memory in the transposed manner comprises storing the bits of the plurality of pieces of data in the plurality of rows of the memory sequentially from a most significant bit (MSB) to a least significant bit (LSB).

3. The method of claim 1, wherein,
  the data is composed of one sign bit, eight exponential bits, and 23 mantissa bits,
  the sign bits of the plurality of pieces of data are stored in a first row of the memory,
  the exponential bits of the plurality of pieces of data are stored in second to ninth rows of the memory, and
  the mantissa bits of the plurality of pieces of data are stored in tenth to 32nd rows of the memory.

4. The method of claim 3, wherein the setting of the refresh period comprises:
  setting a first period value for some of the plurality of rows of the memory in which the sign bits or the exponential bits are stored; and
  setting a second period value for the other rows of the memory in which the mantissa bits are stored.

5. The method of claim 4, wherein the second period value is set to be greater than the first period value.

6. The method of claim 5, wherein the performing of the refresh operation comprises:
  increasing a counter every first period; and
  determining whether to perform the refresh operation for each row of the memory on the basis of the counter every first period.

7. A method of controlling a dynamic random-access memory (DRAM) device, the method comprising:
  storing a plurality of pieces of data including a plurality of bits in a memory in a transposed manner;
  setting at least one refresh period for each of a plurality of rows of the memory; and
  performing a refresh operation of the memory on the basis of the at least one set refresh period,
  wherein the performing of the refresh operation comprises:
  increasing a counter every preset refresh period; and
  determining whether to perform the refresh operation for each of the plurality of rows on the basis of a value of the counter and a refresh period set for each row.

8. The method of claim 7, wherein the performing of the refresh operation comprises:
  performing the refresh operation on some of the plurality of rows whenever the counter is increased; and
  performing the refresh operation on the other rows when the counter corresponds to a predetermined value.

9. A data processing apparatus comprising:
  a processor configured to operate a deep learning application;
  a memory device configured to store data related to the deep learning application; and
  a memory controller configured to control a data storage scheme of the memory device,
  wherein the memory device is composed of a plurality of rows and is configured to store a plurality of pieces of data in a transposed manner, perform a refresh operation on at least some of the plurality of rows every predetermined first period, and perform the refresh operation on the other rows every second period, the second period being different from the first period.

10. The data processing apparatus of claim 9, wherein the memory controller stores a plurality of sign bits extracted from the plurality of pieces of data in a first address area of the memory device, stores a plurality of exponential bits extracted from the plurality of pieces of data in a second address area of the memory device, and stores a plurality of mantissa bits extracted from the plurality of pieces of data in a third address area of the memory device.

11. The data processing apparatus of claim 10, wherein when the plurality of pieces of data is 32-bit floating-point data, the first address area corresponds to a first row of the memory device, the second address area corresponds to second to ninth rows of the memory device, and the third address area corresponds to tenth to 32nd rows of the memory device.

12. The data processing apparatus of claim 9, where the memory device is configured to perform the refresh operation every predetermined period after the plurality of pieces of data are stored in the transposed manner and is configured to skip the refresh operation for at least some of the plurality of rows.

13. The data processing apparatus of claim 12, wherein when the refresh operation is initiated, the memory device increases a predetermined counter variable every period and determines whether to perform the refresh operation on the at least some of the plurality of rows on the basis of the increased counter variable.

14. The data processing apparatus of claim 12, wherein a plurality of mantissa bits of the plurality of pieces of data are stored in the at least some of the plurality of rows.

15. The data processing apparatus of claim 14, wherein the memory device performs the refresh operation on at least one row in which the mantissa bits of the plurality of pieces of data are stored and at least one row in which sign bits or exponential bits of the plurality of pieces of data are stored at different periods.

16. The data processing apparatus of claim 15, wherein the memory device performs the refresh operation on the at least one row in which the sign bits or exponential bits are stored at a predetermined period and skips the refresh operation at least once for the at least one row in which the mantissa bits are stored while the refresh operation is performed a plurality of times.

* * * * *